(12) United States Patent
Shih

(10) Patent No.: US 9,792,044 B2
(45) Date of Patent: Oct. 17, 2017

(54) DECOMPRESSION HISTORY BUFFER READ/WRITE PIPELINES

(71) Applicant: Oracle International Corporation, Redwood Shores, CA (US)

(72) Inventor: Milton Shih, Westford, MA (US)

(73) Assignee: Oracle International Corporation, Redwood Shores, CA (US)

( * ) Notice: Subject to any disclaimer, the term of this patent is extended or adjusted under 35 U.S.C. 154(b) by 106 days.

(21) Appl. No.: 15/042,793

(22) Filed: Feb. 12, 2016

(65) Prior Publication Data
US 2017/0235497 A1  Aug. 17, 2017

(51) Int. Cl.
| H03M 7/34 | (2006.01) |
| --- | --- |
| G06F 3/06 | (2006.01) |
| H03M 7/30 | (2006.01) |
| H03M 7/42 | (2006.01) |
| H03M 7/40 | (2006.01) |

(52) U.S. Cl.
CPC .......... *G06F 3/0608* (2013.01); *G06F 3/0656* (2013.01); *G06F 3/0661* (2013.01); *G06F 3/0683* (2013.01); *H03M 7/30* (2013.01); *H03M 7/40* (2013.01); *H03M 7/4006* (2013.01); *H03M 7/42* (2013.01)

(58) Field of Classification Search
CPC ........ H03M 7/40; H03M 7/30; H03M 7/4006; H03M 7/42; H03M 7/3088; H03M 7/4018; H03M 13/09; H03M 7/6005
USPC .......................... 341/51, 65, 67, 68, 106, 107
See application file for complete search history.

(56) References Cited

U.S. PATENT DOCUMENTS

| 5,847,765 | A | * | 12/1998 | Sanpei | H04N 21/654 |
| --- | --- | --- | --- | --- | --- |
| | | | | | 375/240.05 |
| 7,496,586 | B1 | | 2/2009 | Bonwick et al. | |
| 2006/0028694 | A1 | * | 2/2006 | Soda | H04N 1/32358 |
| | | | | | 358/426.06 |
| 2010/0134330 | A1 | * | 6/2010 | Sakaguchi | H03M 7/4006 |
| | | | | | 341/51 |
| 2011/0154169 | A1 | * | 6/2011 | Gopal | H03M 7/3084 |
| | | | | | 714/807 |
| 2012/0177152 | A1 | * | 7/2012 | Kumar | H03M 13/2957 |
| | | | | | 375/341 |
| 2013/0300591 | A1 | * | 11/2013 | Marpe | H03M 7/40 |
| | | | | | 341/67 |
| 2015/0109156 | A1 | * | 4/2015 | Wang | H03M 1/123 |
| | | | | | 341/141 |

(Continued)

*Primary Examiner* — Linh Nguyen
(74) *Attorney, Agent, or Firm* — Osha Liang LLP

(57) ABSTRACT

A method for a hardware decompression read pipeline, the method including determining a length and a distance of a first entity from a buffer; launching a first read request for reading a first data from the buffer; obtaining a second entity from the buffer; determining a distance of the second entity; calculating a new distance for the second entity; and decreasing a first counter by one for each cycle that data is read and returned from the buffer, wherein, when a first number of pending read data clock cycles in the first counter is less than a predetermined number of clock cycles and there is no read-after-write conflict: launching a second read request prior to completion of the first read request. In other aspects, a method for a hardware decompression write pipeline and systems for a hardware decompression read pipeline and a hardware decompression write pipeline are provided.

20 Claims, 8 Drawing Sheets

(56) References Cited

U.S. PATENT DOCUMENTS

2015/0381202 A1* 12/2015 Satpathy ............ H03M 7/3059
    341/65

* cited by examiner

DECOMPRESSION HISTORY BUFFER READ/WRITE PIPELINES

BACKGROUND

Files are stored by operating systems as compressed files or as uncompressed files. A compressed file characteristically requires less storage space than an uncompressed file. Compression of files is typically done with a compression algorithm, such as a GNU (Gnu Not Unix) ZIP (GZIP) compression algorithm or a Lempel Ziv Jeff Bonwick (LZJB) compression algorithm. These compression/decompression algorithms are also referred to as simply GZIP or LZJB compression/decompression algorithms or as GZIP or LZJB compression/decompression types. Dependent on the operating system used, the user may be able to choose whether to use a compression algorithm, and if so, which compression algorithm is to be used. Further, the user may be able to choose the compression algorithm on a per file type basis. Compression/decompression of files can be done in software or in hardware. In the former case, the compression/decompression is also referred to as software-assisted compression/decompression or simply as software compression/decompression.

Software compression/decompression requires a relatively long amount of time to complete and utilizes additional computing resources of the processor. In contrast hardware compression/decompression is provided, for example, on the same die as the processor or as a separate add-on card for a computing system. In both cases, the physical devices to perform hardware compression/decompression are also referred to as hardware compression/decompression engines or as compression/decompression hardware accelerators. Hardware compression/decompression, when compared to software compression/decompression, generally requires a smaller amount of time to complete and requires less processor resources but at an additional cost. For example, the processor die area on a silicon wafer is at a premium and adding one or more hardware compression/decompression accelerators to the processor die requires additional die area. Similarly, the add-on card with one or more hardware compression/decompression accelerators invokes an additional cost to the computing system. In that respect, it may be beneficial to explore how hardware decompression performance can be increased to speed op file decompression, while keeping a cost-adder to a minimum.

SUMMARY

In general, in one aspect, one or more embodiments disclosed herein relate to a method for a hardware decompression read pipeline, the method comprising: obtaining a first entity from a buffer; determining a length and a distance of the first entity; converting the length and distance for the first entity into a first number of pending read data clock cycles required to read a first data from the buffer corresponding to the first entity; converting the length of the first entity into a second number of pending read data bytes that will be returned by the buffer; storing the first number of pending read data clock cycles in a first counter; storing the second number of pending read data bytes in a second counter; launching a first read request for reading the first data from the buffer corresponding to the first entity; obtaining a second entity from the buffer; determining a distance of the second entity; calculating a new distance for the second entity using the second number of pending read data bytes that need to be read from the buffer for the first entity; attempting to launch a second read request, prior to completion of the first read request, to read a second data from the buffer corresponding to the second entity; and decreasing the first counter by one for each cycle that date is read and returned from the buffer; and decreasing the second counter by a number of valid data bytes returned by the buffer; wherein, when the first number of pending road data clock cycles in the first counter is less than a predetermined number of clock cycles and there is no read-after-write conflict: launching the second read request prior to completion of the first read request.

In another aspect, one or more embodiments disclosed herein relate to a system for a hardware decompression read pipeline, the system comprising: a first buffer configured to store a plurality of data corresponding to a plurality of entities; an entity processing circuit configured to: obtain a first entity from the compressed file data stream, determine a length and a distance of the first entity, launch a first read request and to start to read a first data from the first buffer corresponding to the first entity, obtain a second entity from the compressed file data stream, to determine a length of the second entity, and attempt to launch a second read request, prior to completion of the first read request, to read a second data from the first buffer corresponding to the second entity; a new distance calculator circuit configured to calculate a new distance for the second entity; a data cycle calculator circuit configured to convert the new distance into a first number of pending read data clock cycles; a first counter configured to store the first number of pending read data clock cycles and to decrease the first counter by one for each cycle that read data is returned from the first buffer; a second counter configured to store a second number of pending read data bytes that need to be read from the first buffer and to decrease the second counter by a number of valid bytes returned from the first buffer; and a read-after-write conflict detection circuit that stalls all reads to the first buffer while data from a second buffer is being transferred to the first buffer, wherein, when the first number of pending read data clock cycles in the first counter is less than a predetermined number of clock cycles, and there is no read-after-write conflict, the second read request is launched prior to completion of the first read request.

In yet another aspect, one or more embodiments disclosed herein relate to a method for a hardware decompression write pipeline, the method comprising: obtaining read data from a first buffer; storing the obtained read data as well as literal bytes in a second buffer; recording an amount of read data written to the second buffer; and performing a check whether the amount of data in the second buffer exceeds a predefined threshold, wherein, when the amount of data in the second buffer exceeds the predetermined threshold: writing a first portion of the read data from the second buffer back to the first buffer, storing a second portion of the read data from the second buffer which exceeded the predetermined threshold in the second buffer, and updating the amount of read data in the second buffer by subtracting the amount of data that was transferred to the first buffer.

In another aspect, one or more embodiments disclosed herein relate to a system for a hardware decompression write pipeline, the system comprising: a first buffer configured to store a plurality of data corresponding to a plurality of entities; a second buffer; an entity processing circuit configured to obtain data from the first buffer and to store the data in the second buffer: and a read-after-write conflict detection circuit that keeps track of an amount of data in the second buffer, and performs a check whether the amount of data exceeds a predetermined threshold, wherein, when the amount of data in the second buffer exceeds the predetermined threshold, the read-after-write conflict detection circuit is further configured to: write a first portion of data from the second buffer back to the first buffer, and retain a second portion of data in the second buffer, which exceeded the predetermined threshold.

Other aspects of the disclosure will be apparent from the following description and the appended claims.

DETAILED DESCRIPTION

Figure 1:
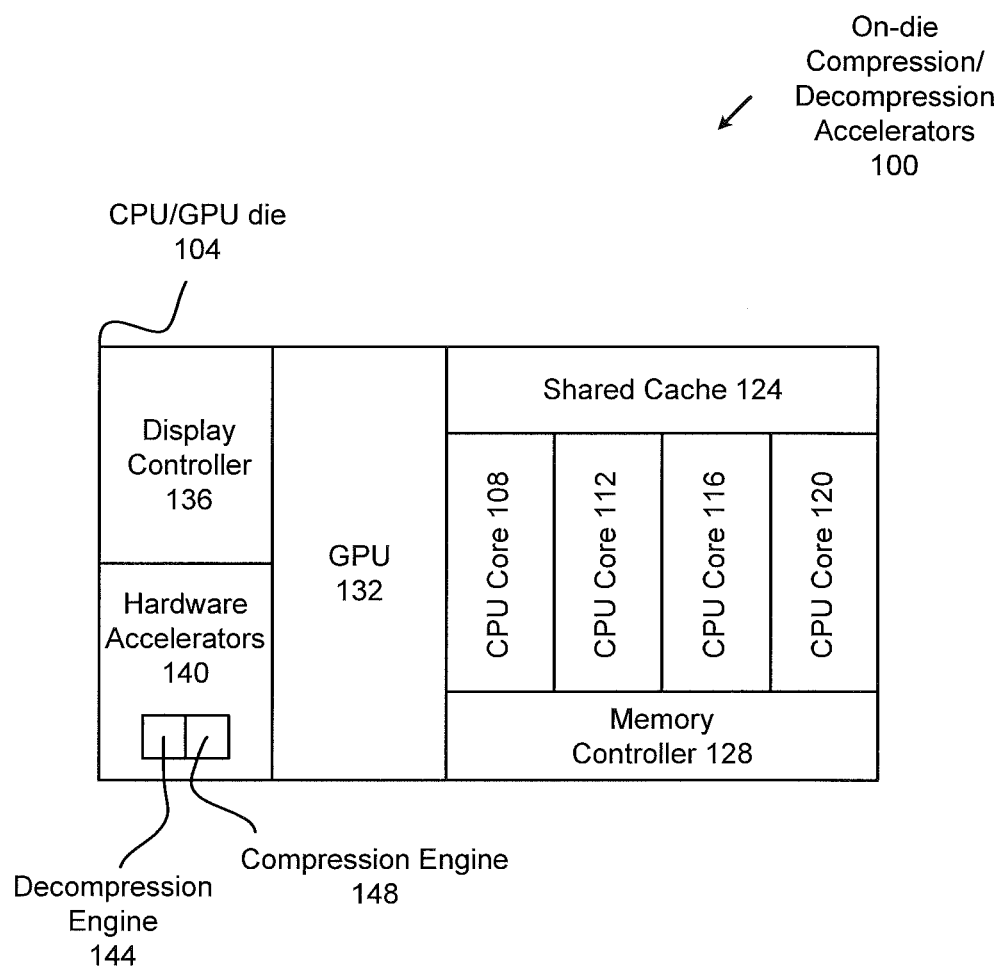
FIG. 1 shows a schematic diagram of on-die compression and decompression engines among other hardware accelerators in accordance with one or more embodiments.

Specific embodiments will now be described with reference to the accompanying figures. In the following detailed description, numerous specific details are set forth in order to provide a more thorough understanding of the disclosure. However, it will be apparent to one of ordinary skill in the art that embodiments may be practiced without these specific details. In other instances, well-known features have not been described in detail to avoid unnecessarily complicating the description.

Throughout the disclosure, certain specific terms will be used to describe elements or functionality of one or more embodiments. However, other terms may be likewise used to describe the same elements or functionality of one or more embodiments. For example, the term "decompression history buffer read/write pipeline" may also be referred to as "decompression read/write pipeline" or "read/write decompression pipeline" or "decompression read/write circuitry" or "hardware decompression read/write pipeline" or just "decompression pipeline" or "decompression circuitry." Further, the terms "hardware compression/decompression engine" may also be referred to as "hardware compression/compression accelerator" or "compression/decompression circuit." Similarly, the term compression/decompression "algorithm" may also be referred to as compression/decompression "type" or compression/decompression "format." Further, the term "processor" may also be referred to as "Central Processing Unit (CPU)" or "Graphics Processing Unit (GPU)" or "CPU/GPU" or "Computing Unit" or System-on-a-Chip (SoC). In addition, the term "compressed file" and "decompressed file" may also be referred to as "compressed data stream" or "decompressed data stream." Further, the term single "die" may also be referred to as a single "chip." Also, the term "length-distance entity" may also be referred to as simply "entity," and "bytes" may also be referred to as "characters."

In general, embodiments of the present disclosure relate to performance enhancements of a hardware decompression read pipeline and of a hardware decompression write pipeline. Specifically, these performance enhancements to the hardware decompression read pipeline may be achieved by increasing the speed at which successive reads to a history buffer can be performed. Further, these performance enhancements to the hardware decompression write pipeline may be achieved by writing information back to the foil width of the history buffer using an external write data buffer. These embodiments will be explained in more detail below.

In addition, embodiments of the present disclosure relate to a hardware decompression read/write pipeline which may be implemented as a part of a system-on-a-chip (SoC). SoC generally refers to an integrated circuit which is located on a single die (chip), e.g., a silicon die. The single die may be obtained from dicing a semiconductor wafer, e.g., a silicon wafer, which has undergone wafer processing. The integrated circuit on the single die may contain a variety of components and component groups, among them analog circuits, digital circuits, mixed signal circuits (a combination of analog and digital circuits), and others.

While in some embodiments, the hardware decompression read/write pipeline may be implemented as a part of a SoC, in other embodiments, the hardware decompression read/write pipeline may be implemented as a part of a system-in-a-package (SiP). A SiP generally refers to several dies (chips) which have been assembled into a single package. The several dies may be stacked onto each other or may be adjacent to each other. Yet in other embodiments, the hardware decompression read/write pipeline may be implemented partly or fully in a field-programmable gate array (FPGA).

In one or more embodiments of the present disclosure, the integrated circuit may be a CPU, a GPU, or a combination thereof. The integrated circuit may be used in desktops, laptops, notebooks, workstations, gaming consoles, and in other systems. In one or more embodiments, the integrated circuit may be operatively connected with a motherboard. However, the present disclosure is not limited to these particular embodiments. Specifically, the present disclosure for the hardware decompression read/write pipeline is applicable to any system, which is configured with a hardware decompression engine of at least one type.

FIG. 1 shows a schematic diagram 100 of on-die compression and decompression engines among other hardware accelerators in accordance with one or more embodiments. In FIG. 1, element 104 depicts a single CPU/GPU die with four CPU cores 108, 112, 116, and 120, each of which may execute program instructions. The decision regarding which particular CPU core executes instructions by a particular program or application may be controlled by the operating system. The CPU cores 108, 112, 116, and 120 are configured to have access to a shared cache 124. The shared cache 124 may contain a portion of program data that has been copied from the system memory (not shown). Therefore, the use of cache may reduce the time needed for a CPU core to access program data. The shared cache 124 may be configured to be shared among the CPU cores 108, 112, 116, and 120.

In FIG. 1, a GPU 132 is also located on the die to create and manipulate a frame buffer from which data may be sent to an output device, such as a display (not shown). Further, a memory controller 128 and a display controller 136 are shown. The memory controller 128 allows the CPU cores to access system memory to retrieve or store program data. As shown in FIG. 1, in one or more embodiments, the memory controller may be residing on the same die as the CPU/GPU die 104. In other embodiments, the memory controller 128 may be residing on a different die.

The display controller 136 in FIG. 1 may receive frame buffer data from the GPU and is configured to output the data into VGA (Video Graphics Array), HDMI (High-Definition Multimedia Interface), DVI (Digital Visual Interface), or DP (Display Port) interfaces to be displayed on a corresponding display (not shown). However, one skilled in the art will appreciate that the display controller 136 may output data into other display interfaces.

The CPU/GPU die 104 in FIG. 1 may also contain hardware accelerators 140, which support various video or audio encoders/decoders (codecs). A decompression engine 144 and a compression engine 148 are located near the hardware accelerators 140. In one or more embodiments, the decompression engine 144 is an LZJB hardware decompression engine and the compression engine 148 is a corresponding LZJB hardware compression engine. In the same embodiments, a hardware decompression read pipeline and a hardware decompression write pipeline may be included in the hardware decompression engine 144.

Further, one skilled in the art will appreciate that the hardware decompression read pipeline and the hardware decompression write pipeline in FIG. 1 may also be located at different locations on the CPU/GPU die 104 to opportunistically benefit from proximity to relevant signals or as a result of "floor planning" to minimize the required area of the CPU/GPU die 104. For example, in one or more embodiments, the hardware decompression read pipeline and the hardware decompression write pipeline may be included with other hardware accelerators 140 in FIG. 1 or as stand-alone circuitry.

In addition, one of ordinary skill in the art will appreciate and understand that the number of CPU cores or the size or capability of the GPU 132 may be changed in FIG. 1. Further, one skilled in the art will appreciate that other embodiments may utilize hardware compression/decompression engines and corresponding decompression read/write pipelines of a different algorithm. For example, the algorithms utilized may be of the GZIP, LZ77, LZJB, or of another type. Accordingly, arrangements other than the one shown in FIG. 1 may be contemplated without departing from the scope of the invention. In addition, elements not shown in FIG. 1 may be added to the CPU/GPU die 104 without departing from the scope of the disclosure.

Figure 2:
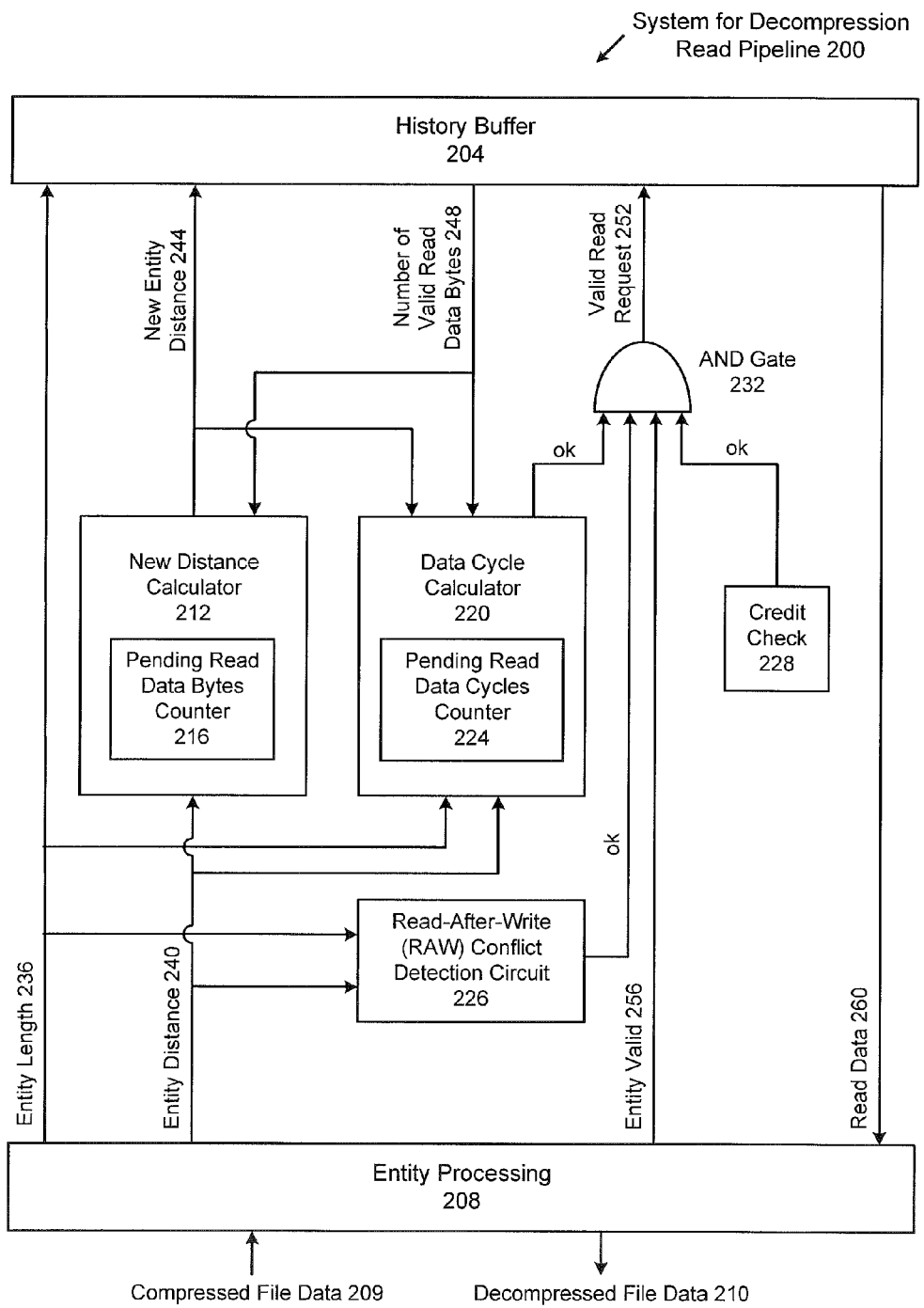
FIG. 2 shows a system for a decompression read pipeline in accordance with one or more embodiments.

Referring now to FIG. 2, FIG. 2 illustrates a system 200 for a decompression read pipeline. The system 200 for a decompression read pipeline in FIG. 2 includes a history buffer 204 which may contain decompressed file data. An entity processing circuit 208 receives compressed file data consisting of a plurality of entities. Specifically, the plurality of entities may include literal characters/bytes. e.g., letters of the alphabet, and length-distance entities. In the embodiment in FIG. 2, the literals may be represented with a numerical code, e.g., with the American Standard Code for Information Interchange (ASCII). In other embodiments, the literals may be represented with a different numerical code. In yet other embodiments, the history buffer 204 may contain data that is not representative of literals, but instead of other symbols or data structures.

In this context, a length-distance entity is a sequence of file data (bytes of a file), in which the "length" refers to the number of consecutive characters that must be read from the history buffer. Further, in this context, "distance" refers to the number of characters between the start of the history buffer (i.e., the most recently written character of the history buffer) and the first character in the sequence of consecutive characters that must be read from the history buffer. Thus, decompression is achieved by replacing length-distance entities with the sequence of characters in the history buffer referenced by the length-distance entity. The sequence of characters that are read from the history buffer represent the most recently decompressed characters/bytes and are simultaneously copied back to the head of the history buffer and output as a decompressed file data stream to memory/external storage, it is noted that literal characters/bytes need no further processing and are simply copied directly to the history buffer and output to memory/external storage. In one or more embodiments, the character(s) are encoded in the ASCII format. Accordingly, as the ASCII encoding is done in 8 bits (1 byte) per character, the distance and length referred to above is measured in byte(s). Other embodiments may utilize other character(s) encoding without departing from the scope of the invention.

Further, the system 200 for a decompression history buffer read pipeline in FIG. 2 also includes an entity processing circuit 208. As illustrated in FIG. 2, compressed file data consisting of literals and length-distance entities 209 are input to the entity processing circuit 208. Further, the entity processing circuit 208 determines an entity length 236 and Inputs the entity length 236 to the history buffer 204, to a data cycle calculator circuit 220, and to a read-after-write (RAW) conflict detection circuit 226. In addition, the entity processing circuit 208 determines an entity distance 240 and inputs the entity distance 240 to a new distance calculator circuit 212, to a data cycle calculator circuit 220, and to the RAW conflict detection circuit 226. The entity processing circuit 208 also inputs an entity valid signal 256 to an AND gate 232. Specifically, the entity valid signal 256 represents an attempt by the entity processing circuit 208 to launch a read request to the history buffer 204, which is however, gated by the AND gate 232.

Specifically, FIG. 2 illustrates that the AND gate 232 also receives an input from the data cycle calculator circuit 220, a credit check circuit 228, and from the read-after-write (RAW) conflict detection circuit 226. The input to the AND gate from the data cycle calculator circuit 220 is asserted to 1 when the number of pending read return data cycles is less than a predetermined number of clock cycles. The input to the AND gate from the credit check 228 is asserted to a logic one when there is enough space in output buffers (not shown), that participate in writing back uncompressed file data to memory or external storage. The input to the AND gate from the read-after-write conflict detection circuit is asserted to a logic one when no data is being transferred from the write data buffer to the history buffer. The output of the AND gate 232 in turn provides the input to the history buffer 204. This input is also referred to as valid read request 252. The entity processing circuit 208 outputs decompressed file data 210 consisting of history buffer read data 260 (i.e., length-distance entities which have been decompressed) and literal bytes/characters. It is noted that the logic to process literal bytes/characters is not shown in FIG. 2.

The new distance calculator circuit 212 includes a pending read data bytes counter 216, which tracks the number of bytes that still need to be read from the history buffer 204. The number of pending read data bytes covers all read requests that are still outstanding, and these read requests may originate from multiple, different length-distance entitles. The new distance calculator circuit 212 provides the new entity distance 244 as input to the history buffer 204 and to the data cycle calculator circuit 220. The data cycle calculator circuit 220 receives the number of valid read data bytes 248 from the history buffer 204, the entity length 236, the entity distance 240, and the new entity distance 244 in order to compute the number of history buffer read data cycles that will occur before all pending read data bytes are returned from the history buffer. Accordingly, the data cycle calculator circuit 220 includes a pending read data cycles counter 224. Similar to the pending read data bytes counter, the pending read data cycles counter keeps track of outstanding read requests that originate from multiple, different length-distance entities. When read data is returned from the history buffer, the pending read data cycles counter is decremented by one, and the pending read data bytes counter is decremented by the number of valid bytes in the read data as indicated by the history buffer.

Embodiments of the system 200 for a decompression read pipeline in FIG. 2 may be implemented on the processor die. Alternatively, the system 200 for the decompression read pipeline may be implemented on another die which is separate from the processor die. In other embodiments, the system 200 for the decompression read pipeline in FIG. 2 may be realized as a combination of hardware and software.

Figure 3:
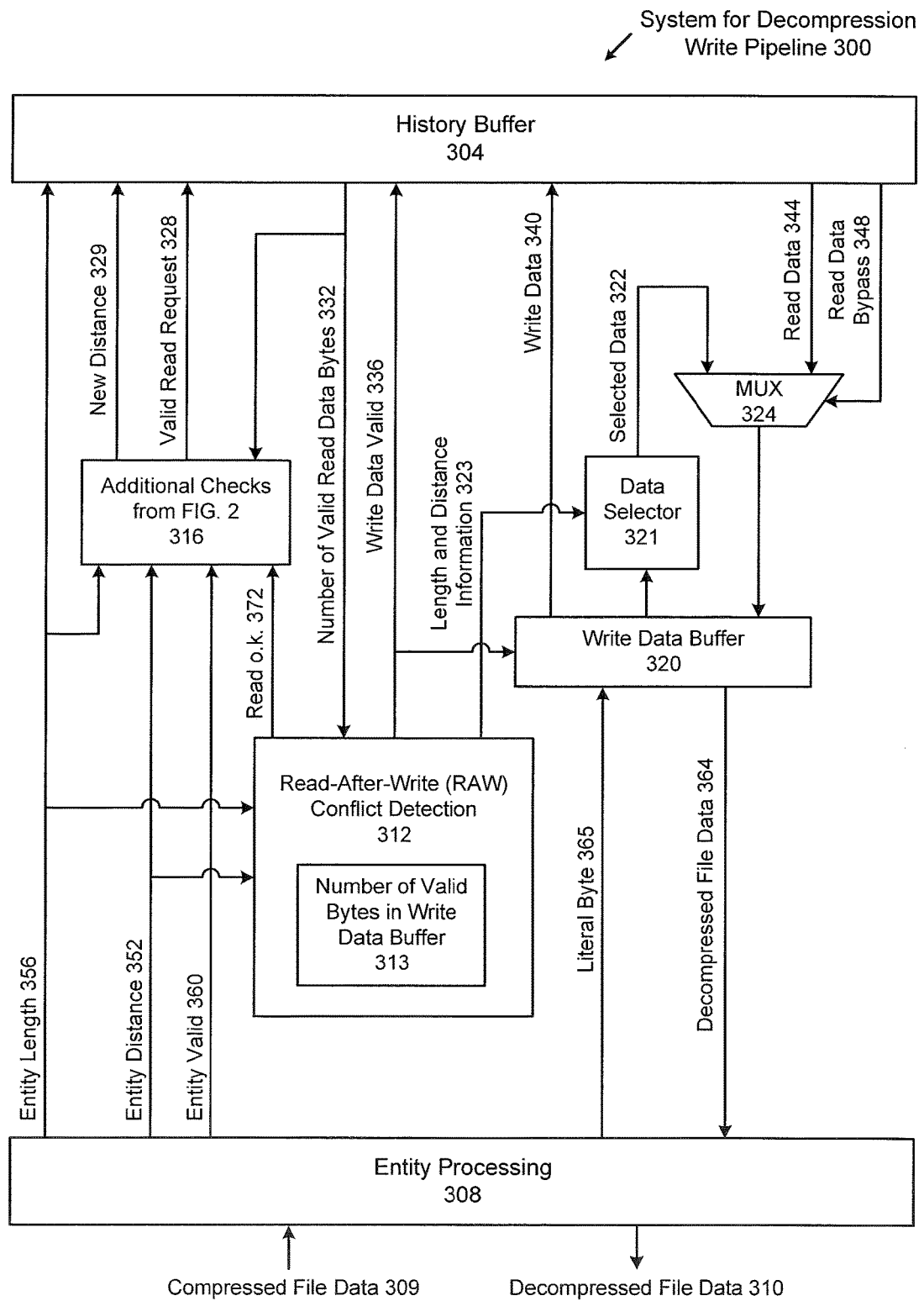
FIG. 3 illustrates a system for a decompression write pipeline in accordance with one or more embodiments.

Referring now to FIG. 3, FIG. 3 illustrates a system 300 for a decompression write pipeline. The system 300 for a decompression write pipeline in FIG. 3 includes a history buffer 304 which contains the most recent N literal bytes of decompressed file data, where N is the maximum value allowed for a "distance" parameter. The maximum value N varies depending on the compression algorithm. In the embodiment in FIG. 3, the literals may be represented with a numerical code, e.g., with the American Standard Code for information Interchange (ASCII). In other embodiments, the literals may be represented with a different numerical code. In yet other embodiments, the history buffer 304 may contain data that is not representative of literals, but instead of other symbols or data structures.

As already described above, in this context, a length-distance entity is a sequence of compressed file data, in which the "length" refers to the number of consecutive characters that must be read from the history buffer. Further, in this context, "distance" refers to the number of characters between the start of the history buffer (i.e., the most recently written character of the history buffer) and the first character in the sequence of consecutive characters that must be read from the history buffer. Thus, decompression is achieved by replacing length-distance entities with the sequence of characters in the history buffer referenced by the length-distance entity. The amount of time (i.e., number of clock cycles) it takes to read the sequence of characters from the history buffer is directly proportional to the number of characters being read (i.e., the length of the entity). In one or more embodiments, the character(s) are encoded in the ASCII format. Accordingly, as the ASCII encoding is done in 8 bits (1 byte) per character, the distance and length referred to above is measured in byte(s). Other embodiments may utilize other character(s) encoding without departing from the scope of the invention.

Further, the system 300 for a decompression history buffer write pipeline in FIG. 3 also includes an entity processing circuit 308, which may be used to parse a compressed data stream in front of the history buffer 304. As illustrated in FIG. 3, compressed file data consisting of literals and length-distance entitles 309, is input to the entity processing circuit 308. Further, the entity processing circuit 308 determines an entity length 356 and inputs the entity length 356 to the history buffer 304, to a read-after-write conflict detection circuit 312, and to an additional checks circuitry 316. In addition, the entity processing circuit 308 determines an entity distance 352 and inputs the entity distance 352 to the additional checks circuitry 316 and to the read-after-write conflict detection circuit 312. Further, the entity processing circuit 308 inputs literal byte(s) to a write data buffer 320. The entity processing circuit 308 outputs decompressed file data 310 consisting of history buffer read data (i.e., length-distance entitles which have been decompressed) and literal bytes/characters. It is noted that the logic to process literal bytes/characters is not shown in FIG. 3. Further, it is noted that the entity processing circuit 308 and the entity processing circuit 208 shown in FIG. 2 are one and the same. The history buffer 304 and the history buffer 204 shown in FIG. 2 are analogous to each other.

The entity valid signal 360 represents an attempt by the entity processing circuit 308 to launch a read request to the history buffer 304. However, the attempted launch of a read request to the history buffer 304 is intercepted by the read-after-write conflict detection circuit 312, which in turn, provides a "Read o.k." signal 372 to the additional checks circuitry 316. The read-after-write conflict detection circuit 312 also inputs length and distance information 323 into a data selector 321. The additional checks circuitry 316 represents the following items from FIG. 2: New Distance Calculator 212, Data Cycle Calculator 220, Credit Check 228, the AND gate 232, and all the inputs to the AND gate 232. The additional checks circuitry 316 passes a valid read request 328 as input to the history buffer 304 when all checks pass (i.e., all four inputs to the AND gate are asserted), which ultimately then launches the read request from the entity processing circuit 308 to the history buffer 304. Further, the additional checks circuitry 316 inputs the new distance 329 to the history buffer 304.

Further, FIG. 3 illustrates that the history buffer 304 inputs the number of valid read data bytes 332 to the read-after-write conflict detection circuit 312, which in turn, provides a write data valid signal 336 to the history buffer 304 and to the write date buffer 320. The history buffer 304 also inputs the number of valid read data bytes 332 to the additional checks circuitry 316. One feature of the read-after-write conflict detection circuit 312 is the ability to detect when history buffer bytes are attempted to be read from the history buffer 304, at the same time that history buffer bytes in the write data buffer 320 are being written back to the history buffer 304. The read-after-write conflict detection circuit 312 also includes circuitry 313 to determine the number of valid bytes in the write data buffer.

In addition, FIG. 3 shows the write data buffer 320 which can also be viewed as an "extension" to the history buffer 304. Logically, the write data buffer 320 contains the most recently written bytes of the history buffer that have not yet been physically written back to the history buffer 304. Specifically, read data 344 are input from the history buffer 304 to the write data buffer 320. In addition, the write data buffer 320 provides write data 340 to the history buffer 304. In a case, when the content of the write data buffer 320 has not yet been written back to the history buffer 304, it is the write data buffer 320 from where bytes may need to be read from instead of from the history buffer 304. Accordingly, FIG. 3 illustrates a multiplexer (MUX) 324 which receives its input from the write data buffer 320 and also from the history buffer 304. In addition, the MUX 324 has a selector "read data bypass" 348 provided by the history buffer 304. Specifically, the selector to the MUX 324 selects between data that is provided by the history buffer 304 and data that is stored in the write data buffer 320. When the "read data bypass" 348 is asserted, the write data buffer 320 provides the selected read data 322 via the data selector 321 and the history buffer 304 is bypassed. The output of the MUX 324 is provided as decompressed file data 364 to the entity processing circuit 308. The entity processing circuit 308 outputs the read data as decompressed file data 310. It is noted, that in one or more embodiments it is possible for a length-distance entity to reference a sequence of characters/ bytes that is contained partially in the history buffer and partially in the write data buffer.

Embodiments of the system 300 for a decompression history buffer write pipeline in FIG. 3 may be implemented on the processor die. Alternatively, the system 300 for the decompression write pipeline may be implemented on another die which is separate from the processor die. In other embodiments, the system 300 for the decompression write pipeline in FIG. 3 may be realized as a combination of hardware and software.

Figure 4:
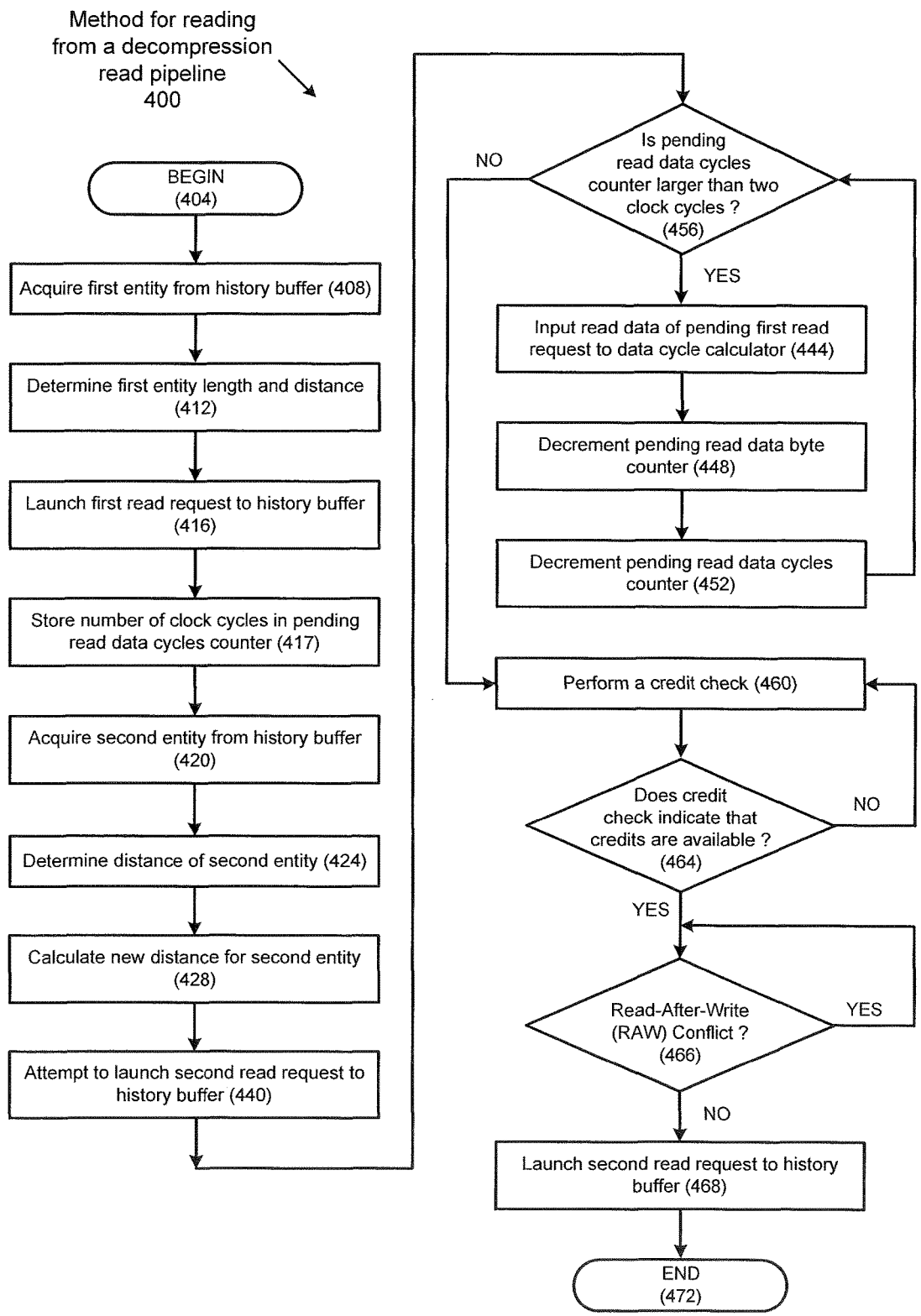
FIG. 4 shows a method flowchart for a decompression read pipeline in accordance with one or more embodiments.

FIG. 4 illustrates a flowchart for a method 400 for a decompression history buffer read pipeline in accordance with one or more embodiments. The method 400 for reading from a decompression read pipeline starts at step 404. In step 408, a first length-distance entity is obtained from an entity processing circuit such as the one shown in FIG. 2. Subsequently, the method proceeds to step 412 in FIG. 4, where the length and the distance of the obtained first entity is determined. At step 416, a first read request is launched to the history buffer. In this context, the first read request starts to read the data from the history buffer. In other words, the first obtained length-distance entity represents compressed information regarding file data and indicates where a string of file data can be found in the history buffer. When the first read request is launched to the history buffer, the pending read data bytes counter 216 is incremented with the number of characters/bytes (i.e., the length of the first entity) being read from the history buffer. In step 417, the pending read data cycles counter 224 is updated with the number of history buffer read data cycles it will take to read the required number of characters/bytes from the history buffer. The larger the length value, the more read data cycles will be required for the history buffer to return the requested read data.

At step 420, a second length-distance entity is obtained from the entity processing circuit. Similar to the first entity, the distance of the obtained second entity is determined at step 424. Then, at step 428, a new distance is calculated for the second obtained entity. Specifically, it is necessary to calculate this new distance for the second entity, because the originally-determined distance of the second entity merely refers back to where the string of file data corresponding to the second entity can be found in the history buffer. However, since the first read request has not yet completed and the corresponding string of file data for the first entity has not yet been written back to the beginning of the history buffer, the new calculated distance for the second entity accounts for the length of the not yet written back history buffer data that will be returned as a result of the first read. Accordingly, one advantageous effect of the disclosure is the ability to launch a second read request soon after the first read request has been launched but prior to the completion of the first read request, as will be explained in more detail in FIGS. 6a through 6f.

Still referring to FIG. 4, the method proceeds in step 440 and attempts to launch a second read request to the history buffer to read a second data from the history buffer which corresponds to the second entity. The method continues at step 456, where a check is performed to determine whether the content of the pending read data cycles counter is larger than 2. If the answer is "NO", then the method proceeds to step 460. If the answer is "YES", then at step 444, history buffer read data is returned for the first read request. The number of valid bytes returned from the history buffer this cycle are input to a data cycle calculator, such as the data cycle calculator 220 in FIG. 2, and to a new distance calculator, such as the new distance calculator 212 in FIG. 2. In steps 448 and 452, a pending read data bytes counter and the pending read data cycles counter are decremented by the number of valid bytes returned, and one, respectively, to account for the ongoing receipt of read data from the first read request. Subsequently, the method continues at step 456.

At step 460, another check is performed to determine whether credits are available. In this context, "credits" refer to whether space is available in output buffers (not shown), which participate in writing a portion of the decompressed file out to a storage disk or to another mass storage device. If the result of the check at step 464 is "No," then the method returns to step 460, where the method continues to check for credits. Eventually, if no credits are available, the method 400 for reading from a decompression read pipeline would need to be temporarily halted until credits become available. If the result of the check at step 464 is "Yes," then a read-after-write conflict check is performed in step 466. If a conflict is detected, then the method waits one cycle and repeats the read-after-write conflict check. If no conflict is detected, then the method proceeds to step 468, where the second read request to the history buffer is launched. Subsequently, the method ends at step 472 in FIG. 4.

According to the method described above, a file is decompressed by replacing the length-distance entities from the compressed data file stream with corresponding read data from within the history buffer. In the embodiments described in reference to FIG. 4, the check at step 456 is performed with respect to two clock cycles. In other embodiments, the check at step 456 may be performed with respect to a different number of pending read data cycles, which may be smaller or larger than two depending on foe read latency of the memory technology used to implement the history buffer, and the physical distance of the history buffer in relation to the decompression read pipeline logic. Further, the disclosure is not limited to the embodiments described in reference to FIG. 4. One of ordinary skill in the art would readily appreciate that the method 400 for reading from a decompression read pipeline could be realized differently without departing from the scope of the invention. For example, in the embodiment described with respect to FIG. 4, a different but analogous flow could be used to achieve the same objective. Specifically, one skilled in the art will appreciate that other embodiments may utilize a different order of the steps described in reference to FIG. 4. Further, additional steps may be introduced or removed from the flowchart in FIG. 4, without departing from the scope of the disclosure.

Figure 5:
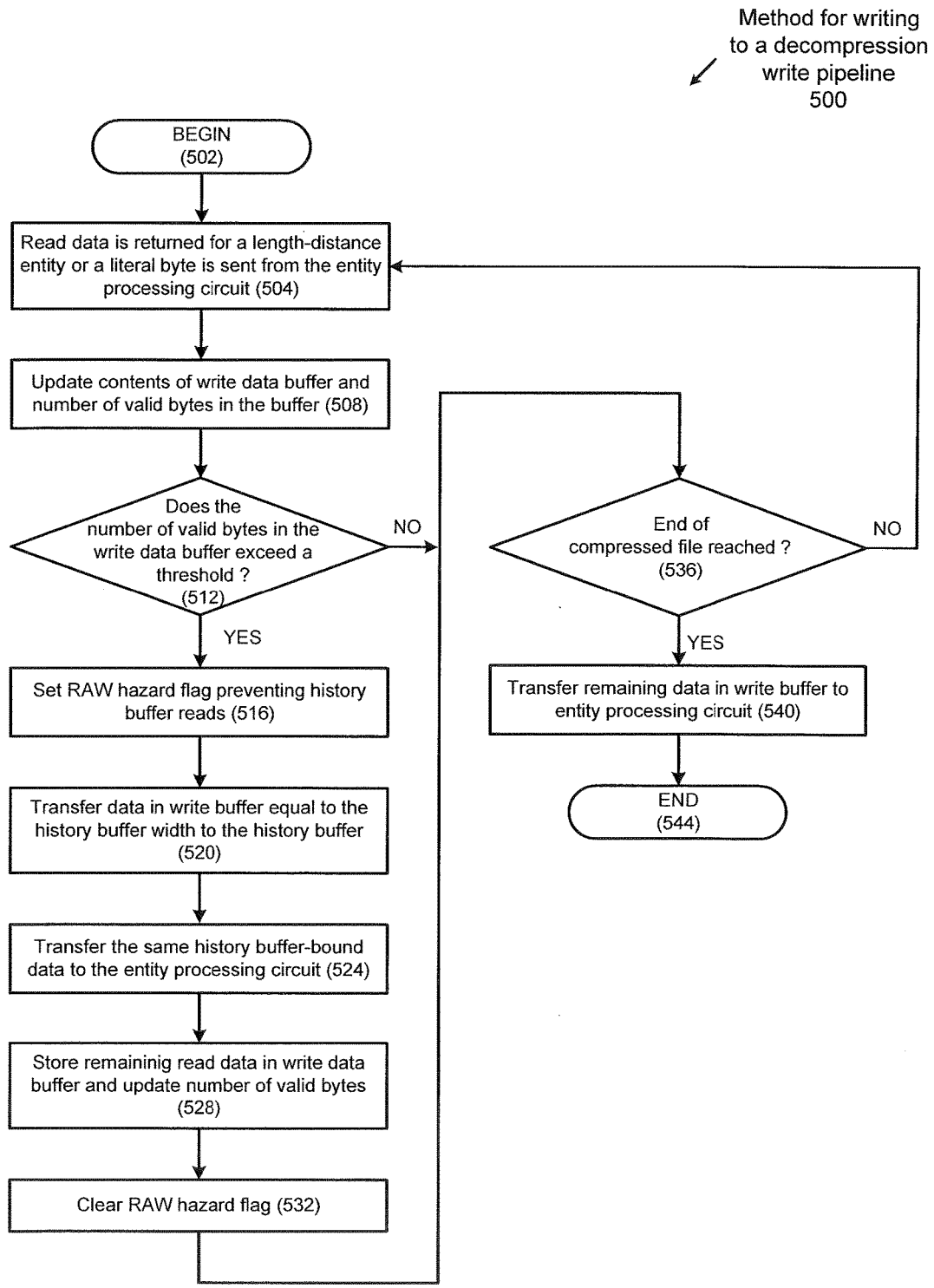
FIG. 5 illustrates a method flowchart for a decompression write pipeline in accordance with one or more embodiments.

FIG. 5 illustrates a flowchart for a method 500 for a decompression write pipeline in accordance with one or more embodiments. The method 500 for a decompression write pipeline starts at step 502. It is assumed in this step that the entity processing circuit has received compressed file data and has began processing the length-distance entitles and literals contained in the compressed file data stream. In step 504, data is sent to the write data buffer in the form of either history buffer read return in response to a previously issued history buffer read request, or as a literal byte sent from the entity processing circuit. The read data or the literal is written to the write data buffer.

The write data buffer contains the most recent characters/bytes of the history buffer that haven't actually been written back to the history buffer. Thus, when processing a length-distance entity, it is possible that bytes need to be read which are contained in the write data buffer as opposed to reading data directly from the history buffer. When this case occurs, a data selector is used to select the bytes being read from the write data buffer. These bytes are fed into a multiplexer. When the read data bypass signal is asserted (i.e., when the required data does not exist in the history buffer) then the source for data being written to the write data buffer becomes the write data buffer itself. In step 508 the counter that keeps track of the number of valid characters/bytes in the write data buffer is updated with the number of characters/bytes written to the write data buffer. This value is given by the number of valid bytes field that is sent from the history buffer in the same cycle that valid read data is either returned by the history buffer or read from the write data buffer in the read data bypass case. In the case of a literal byte being written to the write data buffer, the counter is incremented by one.

In step 512, the number of valid bytes in the write data buffer is compared to a predetermined threshold. If the threshold is not exceeded (i.e., "NO") then the method proceeds to step 536 and resumes processing the compressed data file stream unless the end of the compressed file has been reached. If the threshold is exceeded ("YES") at step 512, then data in the write buffer must be transferred back to the history buffer. During this time, as the characters/bytes in the write data buffer and the history buffer are in a state of flux, no read operations can be launched to the history buffer. In order to prevent reads from being launched, the read-after-write conflict detection circuit sets a read-after-write (RAW) hazard flag in step 516 while data is being transferred to the history buffer. This flag prevents any read operations to the history buffer from being launched until the flag is de-asserted. The same write data that is transferred to the history buffer in step 520 is also simultaneously transferred to the entity processing circuit in step 524. The data transferred to the entity processing circuit represents the decompressed file data and is written back to memory or external storage. Any remaining read data are stored in the write data buffer and the number of valid bytes is updated in step 528. Subsequently, the RAW hazard flag is cleared in step 532 and the method proceeds to step 536 to check whether the end of the compressed file has been reached.

The number of characters/bytes transferred to the history buffer and entity processing circuit is equal to the width of the history buffer, where "width" represents the number of characters/bytes in a single entry of the memory structure used to store the history buffer data. The memory structure is typically, though not restricted to, a RAM (random access memory). Any remaining characters/bytes in the write data buffer are shifted to the head of the write data buffer and remain there until the next the write data buffer transfer. The RAW hazard flag is de-asserted and processing of length-distance entities and literals continues back at step 504 unless the end of the compressed file is detected in step 536. If the end of the compressed file is reached, then any remaining data in the write data buffer is transferred back to the entity processing circuit to be written back to memory or external storage in step 540. These are the last bytes of the decompressed file and the method then ends at step 544.

According to the method described above, a file is decompressed by replacing the compressed entities of the file with corresponding read data from within the history buffer. Further, according to the method described above, decompressed data is written back to the full width of the history buffer by utilizing a write data buffer. However, the method described above is not limited to the particular embodiments described in reference to FIG. 5. One of ordinary skill in the art would readily appreciate that the method 500 for a decompression write pipeline could be realized differently without departing from the scope of the invention. For example, in the embodiment described in reference to FIG. 5, a different, but analogous flow could be used to achieve the same objective. Specifically, one skilled in the art will appreciate that other embodiments may utilize a different order of the steps described in reference to FIG. 5. Further, additional steps may be introduced or removed from the flowchart in FIG. 5, without departing from the scope of the disclosure.

The advantages of using a write data buffer to extend the history buffer will be explained below. Logically, the history buffer is a sliding window of the most recent N characters/bytes of decompressed file data. When new data is written to the history buffer, it is always written to the head of the history buffer. The oldest data "drops off" the tail of the history buffer as the history buffer window slides to accommodate the newly written characters/bytes. For a typical compression algorithm, the size of the history buffer is in the thousands of characters/bytes, therefore using a shift register to implement the history buffer is not feasible due to the large amount of logic that is needed to shift thousands of bytes at once. Instead, history buffers are implemented with RAM structures that restrict reading and writing to individual entries of the RAM. For example, a 32 KB history buffer can be represented by a 2048 entry RAM where each entry contains 16 characters/bytes. The disadvantage of using a RAM to implement the history buffer is that shifting data as new data is added becomes more complicated. This is a result of only being able to operate on a single entry of the RAM in any given cycle so there is no way to shift all the bytes of the RAM at the same time. It also becomes more difficult to perform writes smaller than the width of the RAM. For example, if the width of the RAM is 16 bytes, and one wants to write only 8 bytes of data to a given entry, then one must perform a "read-modify-write" operation on that entry in order to not disturb the 8 bytes of the entry that are not being overwritten. That is, the full 16-byte entry must be first read ("read"), then the new 8 bytes will overwrite the old 8 bytes of the entry ("modify"). Finally, this new 16-byte entry is written back to the RAM ("write"). This is a very time-consuming operation which is common during decompression.

A write data buffer as described in the present disclosure advantageously writes to the history buffer when there is enough data to write an entire entry's worth of characters/bytes. Thus, read-modify-write operations are eliminated because an entire entry is written at once as opposed to a partial write of an entry. Shifting of the history buffer can be accomplished by overwriting the oldest entry (i.e., the entry that contains the oldest bytes) of the history buffer RAM, then updating the head of the history buffer to point to the overwritten entry, which has now become the newest entry of the history buffer RAM.

Figure 6A:
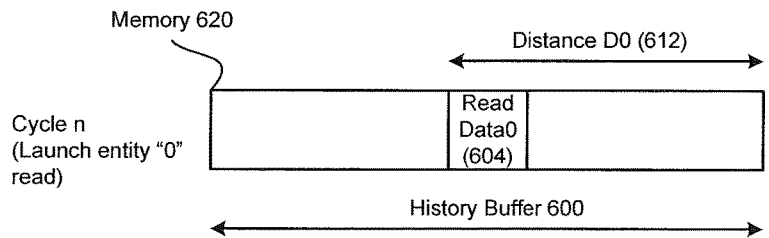
FIGS. 6a-6f show an example for a decompression read pipeline in accordance with one or more embodiments.
Figure 6B:
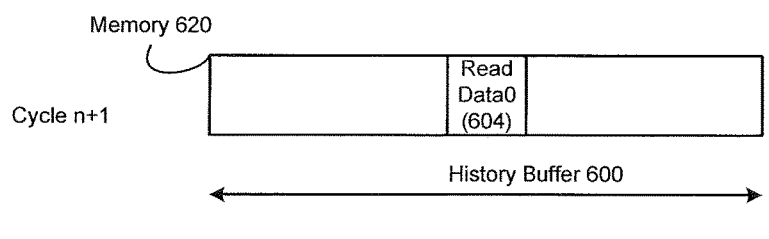

FIGS. 6a through 6f illustrate an example for a decompression read pipeline memory 620, in which a history buffer 600 is disposed. FIG. 6a represents a clock cycle "n" in which an entity "0" read (a first read request) is launched. The read data0 (604) are disposed within the history buffer 600 at a distance D0 (612) to the beginning of the history buffer. In FIG. 6b, the next clock cycle "n+1" is shown and the read data0 (604) are not yet written back to the front of the history buffer 600 on the right-hand side because of the latency of memory 620. The history buffer is unchanged and the read data0 (604) are still in the same location with respect to memory 620.

Figure 6C:
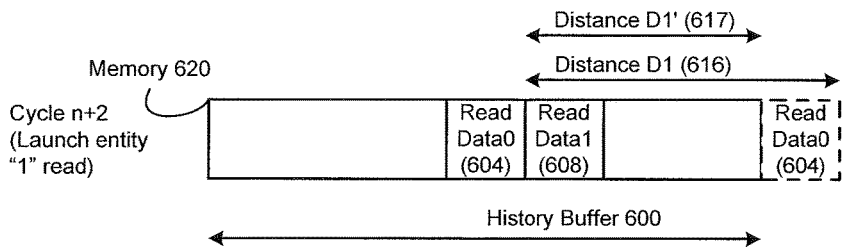

FIG. 6c illustrates the clock cycle "n+2," where an entity "1" read (a second read request) is launched. The read data1 (608) are also disposed within the history buffer 600 adjacent to and on the right-hand side to read data0 (604). However, in order that the launched entity "1" read retrieves the correct data from the history buffer 600, a new distance D1' (617) must be calculated to account for the read data0 (604), which have not yet been written back to the front of the history buffer. Specifically, the distance D1' is calculated by taking the original distance of entity "1," D1 (616), and subtracting the width of not yet written back read data0 (604). The not yet written back read data0 (604) are indicated in FIG. 6c with dotted lines.

Figure 6D:
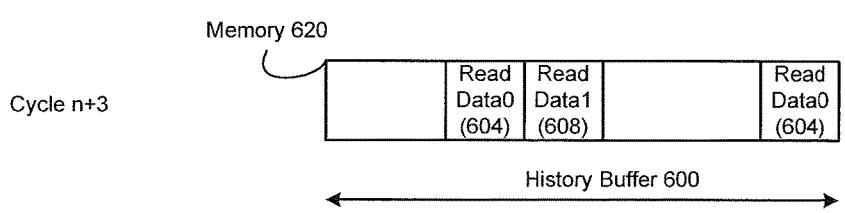
Figure 6E:
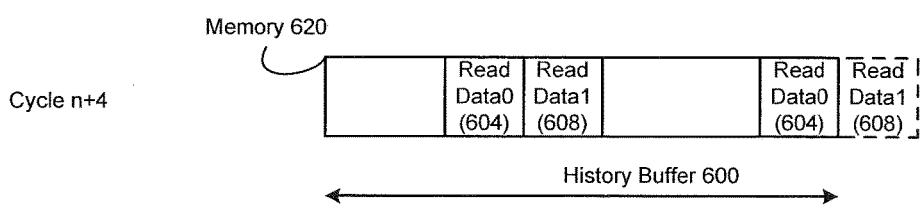
Figure 6F:
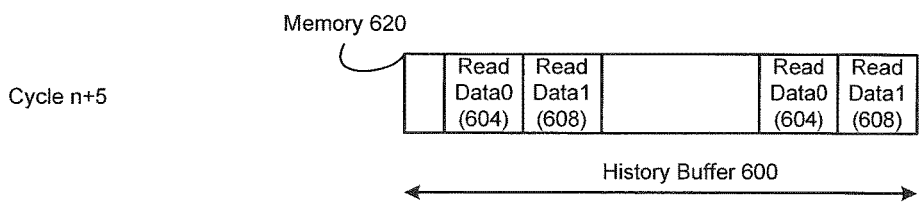

FIG. 6d shows the clock cycle "n+3," where the read data0 (604) is now written back to the front of the history buffer. Meanwhile, the entity read was already launched a clock cycle earlier, which is an advantageous effect of the disclosure. FIG. 6e illustrates clock cycle "n+4," where the dotted lines indicate that read data1 (608) will be written back to the front of the history buffer 600 in the next clock cycle. Finally, FIG. 6f indicates that the read data1 (608) in clock cycle "n+5" are now written back to the front of the history buffer 600. In summary, FIGS. 6a through 6f illustrate allowing a second read request to be launched, even though the first read request has not completed yet and even though the second read request is dependent on the width of the first read data. Accordingly, latency effects of memory 620 can be minimized and decompression speed is increased.

FIGS. 7a through 7f illustrate an example for writing to a decompression write pipeline in accordance with one or more embodiments. Specifically, FIGS. 7a through 7d illustrate a history buffer memory 708. Element 700 denotes the width of the history buffer memory 708. In addition, the portion of the history buffer memory 708 filled with data is denoted by element 720, while the portion of the history buffer memory which is still empty is denoted by element 716. Further, FIGS. 7a through 7d show a write buffer memory 712. The width of the write data buffer memory 712 in FIGS. 7a through 7d is denoted with element 704. Further, the portion of the write data buffer memory 712 which is still empty is identified by element 744. The write buffer memory most be sized so as not to overflow. The actual size depends on several factors, such as the maximum number of valid bytes that can be returned from the history buffer in a single cycle, and the time it takes to transfer write buffer data to the history buffer.

Figure 7A:
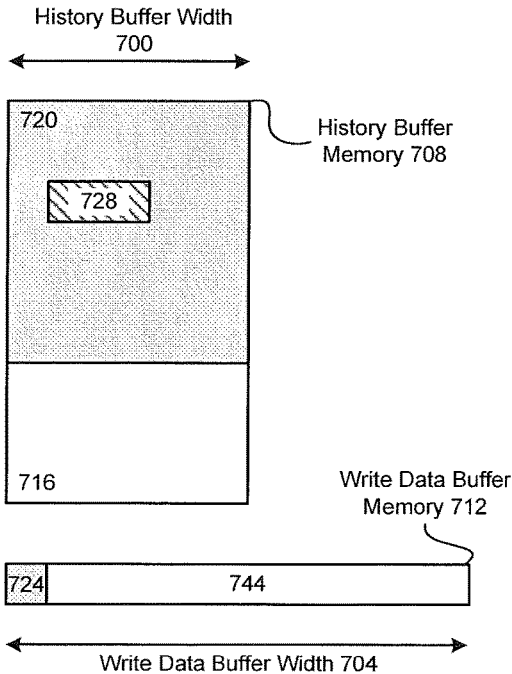
FIGS. 7a-7d show an example for a decompression write pipeline in accordance with one or more embodiments.
Figure 7B:
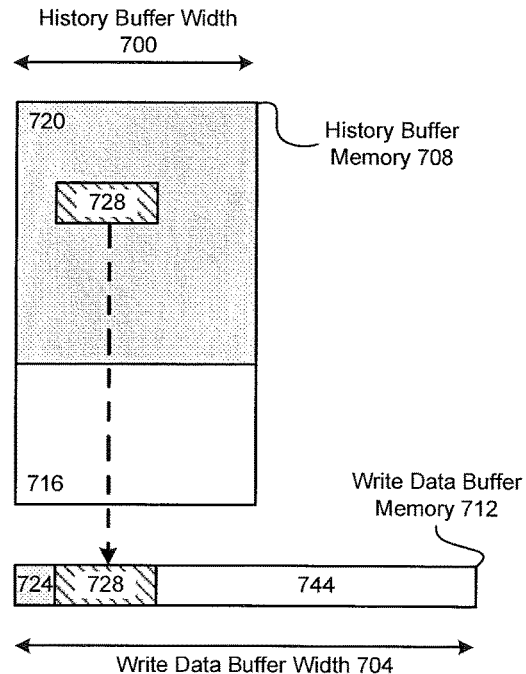

Specifically in FIG. 7a, a first data 724 is already disposed within the write data buffer memory 712. However, most of the write data buffer memory 712 is still empty. In FIG. 7a, a second data 728 is illustrated within the history buffer memory 708. Now referring to FIG. 7b, the second data 728 within the history buffer memory 708 is obtained, e.g., read, and stored in the write data buffer memory 712, adjacent to the first data 724. In FIG. 7b, less than half of the write data buffer memory 712 still remains empty.

Figure 7C:
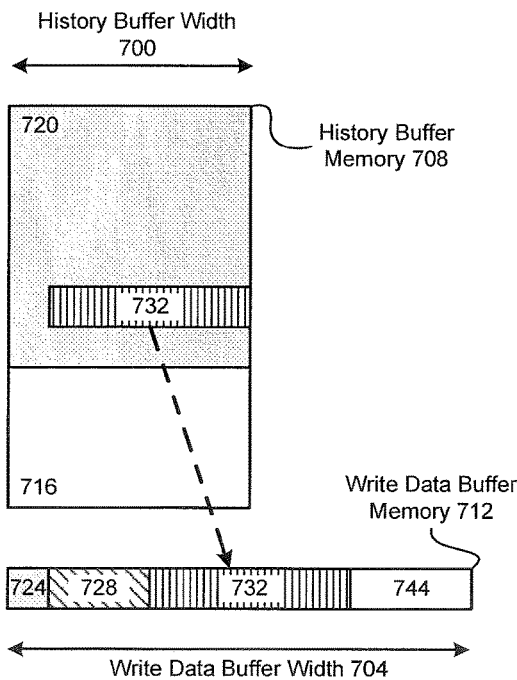
Figure 7D:
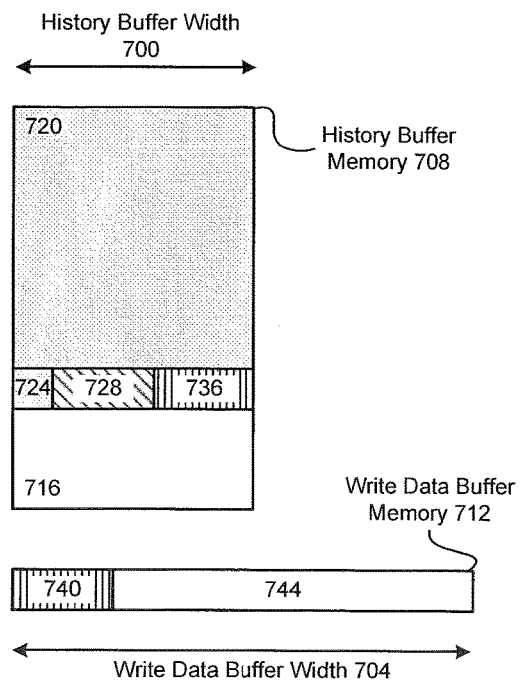

In FIG. 7c, a third data 732 is obtained from the history buffer memory 708. However, the width of the third data 732 in addition to the width of the first data 724 and the second data 728 exceeds a width of the write data buffer memory 712 that is equal to the history buffer width 700. In this case, the third data 732 is stored in the write data buffer memory 712. Subsequently, in FIG. 7d, the first data, the second data, and a first portion 736 of the third data, which still fit in the width of the write data buffer memory 712 that is equal to the history buffer width 700, is written back to the history buffer memory 708. Further, the second portion 740 of the third data, which did not fit in the width of the write data buffer memory 712 that is equal to the history buffer width 700, is retained in the beginning of foe write data buffer memory 712. In FIG. 7d, most of the write data buffer memory 712 is again empty.

In one or more embodiments, the hardware decompression read/write pipelines include hardware (e.g., circuitry), software, firmware, or any combination thereof that include functionality to perform at least some functions described herein in accordance with one or more embodiments of the present disclosure. In one or more embodiments, the hardware decompression read/write pipelines of the present disclosure are, at least in part, a software application, or a portion thereof, written in any programming language that includes instructions stored on a non-transitory computer readable medium which, when executed by one or more processors in a computing device, enable the computing device to perform the functions described in accordance with one or more embodiments of the disclosure.

Further, one or more embodiments of the present disclosure may be implemented as decompression read/write pipelines for the decompression of files into the file system (100) in FIG. 1 of U.S. Pat. No. 7,496,586, which is incorporated herein by reference in its entirety. In addition, in one or more embodiments, the systems and methods for decompression read/write pipelines may include circuitry and may be utilized to decompress files which were previously compressed with a lossless compression algorithm, such as a Lempel Ziv Jeff Bonwick (LZJB) compression algorithm, a GNU (Gnu Not Unix) ZIP (GZIP) compression algorithm, or a Lempel Ziv compression algorithm (LZ77). However, one of ordinary skill in the art would appreciate that the disclosure is not limited to the lossless algorithms referenced above, and the file may be previously compressed with other lossless or lossy algorithms without departing from the scope of the disclosure.

Figure 8:
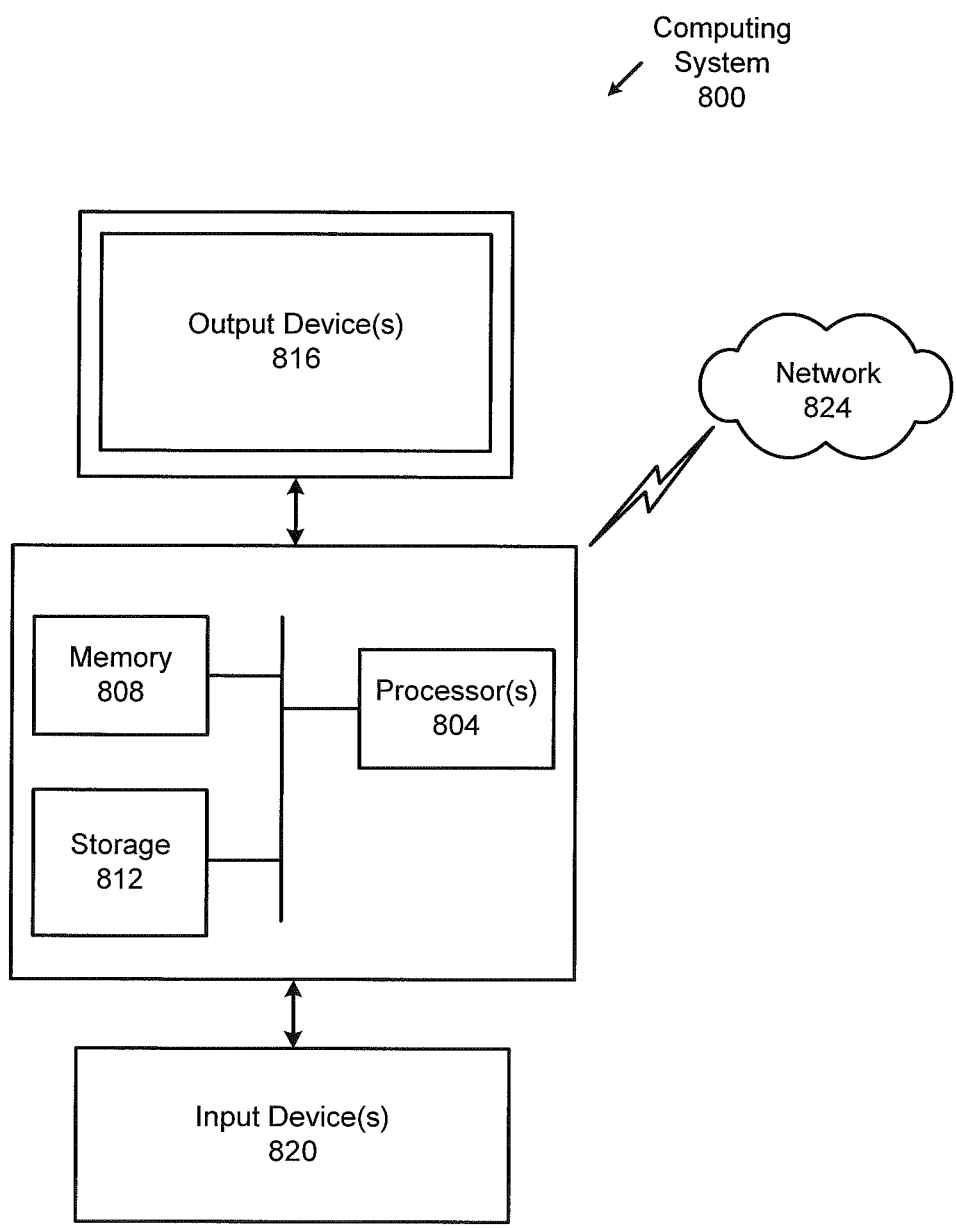
FIG. 8 shows a computing system in accordance with one or more embodiments.

One or more embodiments of the present disclosure may be implemented on virtually any type of computing system, regardless of the platform being used. In one or more embodiments, the computing system may be an embedded microcontroller with one or more microprocessors. For example, as shown in FIG. 8, the computing system (800) may include one or more processor(s) (804), associated memory (808) (e.g., random access memory (RAM), cache memory, flash memory, etc.), one or more storage device(s) (812) (e.g., a hard disk, an optical drive such as a compact disc (CD) drive or digital versatile disc (DVD) drive, a flash memory stick, a solid state drive (SSD), etc.), and numerous other elements and functionalities. The processor(s) (804) may be an integrated circuit for processing instructions. For example, the processor(s) may be one or more cores, or micro-cores of a processor. The computing system (800) may also include one or more input device(s) (820), such as a touchscreen, keyboard, mouse, microphone, touchpad, electronic pen, or any other type of input device.

Further, the computing system (800) may include one or more output device(s) (816), such as a screen (e.g., a liquid crystal display (LCD), a plasma display, touchscreen, projector, or other display device), a printer, external storage, or any other output device. One or more of the output device(s) may be the same or different from the input device(s). The computing system (800) may be connected to a network (824) (e.g., a local area network (LAN), a wide area network (WAN) such as the Internet, mobile network, or any other type of network) via a network interface connection (not shown). The input and output device(s) may be locally or remotely (e.g., via the network (824)) connected to the processor(s) (804), memory (808), and storage device(s) (812). Many different types of embedded and non-embedded computing systems exist, and the aforementioned input and output device(s) may take other forms. In one or more embodiments, the computing system may be a headless system, e.g. no input devices 820 and/or no output devices 816 may be utilized.

Software instructions in the form of computer readable program code to perform embodiments may be stored, in whole or in part, temporarily or permanently, on the non-transitory computer readable medium. Such non-transitory computer readable medium maybe an erasable programmable read only memory (EPROM), a flash memory, an internal or external storage device, a DVD, a CD, or any other computer or embedded microcontroller readable storage medium. Specifically, the software instructions may correspond to computer readable program code or embedded microcontroller readable program code that when executed by a processor(s), is configured to perform embodiments of the disclosure. In addition, the software instructions and the associated non-transitory computer readable medium may also be referred to as firmware. In one or more embodiments, the firmware may be updated.

While the disclosure has been described with respect to a limited number of embodiments, those skilled in the art having benefit of this disclosure, will appreciate that other embodiments can be devised which do not depart from the scope of the disclosure as disclosed herein. Accordingly, the scope of the disclosure should be limited only by the attached claims.

What is claimed is:

1. A method for a hardware decompression read pipeline, the method comprising:
   obtaining a first entity from a buffer;
   determining a length and a distance of the first entity;
   converting the length and distance for the first entity into a first number of pending read data clock cycles required to read a first data from the buffer corresponding to the first entity;
   converting the length of the first entity into a second number of pending read data bytes that will be returned by the buffer;
   storing the first number of pending read data clock cycles in a first counter;
   storing the second number of pending read data bytes in a second counter;
   launching a first read request for reading the first data from the buffer corresponding to the first entity;
   obtaining a second entity from the buffer;
   determining a distance of the second entity;
   calculating a new distance for the second entity using the second number of pending read data bytes that need to be read from the buffer for the first entity;
   attempting to launch a second read request, prior to completion of the first read request, to read a second data from the buffer corresponding to the second entity; and
   decreasing the first counter by one for each cycle that data is read and returned from the buffer; and
   decreasing the second counter by a number of valid data bytes returned by the buffer;
   wherein, when the first number of pending read data clock cycles in the first counter is less than a predetermined number of clock cycles and there is no read-after-write conflict:
   launching the second read request prior to completion of the first read request.

2. The method according to claim 1, wherein when the first entity and the second entity are length-distance entities, a file is decompressed by replacing the length-distance entities of the file with corresponding read data from the buffer.

3. The method according to claim 1, wherein when one of the first entity or the second entity is a literal byte and the other of the first entity or the second entity is a length-distance entity, no read request is launched for the literal byte, and the file is decompressed by replacing the length-distance entity of the file with corresponding read data from the buffer, while the literal byte remains unchanged.

4. The method according to claim 1, wherein the new distance for the second entity is calculated by subtracting a number of bytes corresponding to the first data that are remaining to be written back to a front of the buffer, from the original distance of the second entity.

5. The method according to claim 1, wherein a credit check is performed prior to launching the first read request or the second read request, and when the respective credit check indicates that credits are available, the first read request or the second read request is launched.

6. The method according to claim 1, wherein the read-after-write conflict check prevents read requests from being issued if data from a second buffer is being transferred to the buffer.

7. The method according to claim 1, wherein the predetermined number of clock cycles is two.

8. The method according to claim 1, wherein the method decompresses a file that is compressed with a lossless algorithm.

9. The method according to claim 8, wherein the lossless algorithm comprises at least one of a Lempel Ziv Jeff Bonwick (LZJB) compression algorithm, a GNU (Gnu Not Unix) ZIP (GZIP) compression algorithm, and a Lempel Ziv compression algorithm (LZ77).

10. A system for a hardware decompression read pipeline, the system comprising:
    a first buffer configured to store a plurality of data corresponding to a plurality of entities;
    an entity processing circuit configured to:
    obtain a first entity from the compressed file data stream,
    determine a length and a distance of the first entity,
    launch a first read request and to start to read a first data from the first buffer corresponding to the first entity,
    obtain a second entity from the compressed file data stream, to determine a length of the second entity, and
    attempt to launch a second read request, prior to completion of the first read request, to read a second data from the first buffer corresponding to the second entity;
    a new distance calculator circuit configured to calculate a new distance for the second entity;
    a data cycle calculator circuit configured to convert the first entity distance into a first number of pending read data clock cycles;

a first counter configured to store the first number of pending read data clock cycles and to decrease the first counter by one for each cycle that read data is returned from the first buffer;

a second counter configured to store a second number of pending read data bytes that need to be read from the first buffer and to decrease the second counter by a number of valid bytes returned from the first buffer; and a read-after-write conflict detection circuit that stalls all reads to the first buffer while data from a second buffer is being transferred to the first buffer, wherein, when the first number of pending read data clock cycles in the first counter is less than a predetermined number of clock cycles, and there is no read-after-write conflict, the second read request is launched prior to completion of the first read request.

11. The system according to claim 10, wherein the first buffer is a history buffer and the second buffer is a write data buffer.

12. The system according to claim 10, wherein the system is implemented on a single die.

13. The system according to claim 10, wherein the system decompresses a file that is compressed with at least one of a Lempel Ziv Jeff Bonwick (LZJB) compression algorithm, a GNU (Gnu Not Unix) ZIP (GZIP) compression algorithm, and a Lempel Ziv compression algorithm (LZ77).

14. A method for a hardware decompression write pipeline, the method comprising:
obtaining read data from a first buffer;
storing the obtained read data as well as literal bytes in a second buffer;
recording an amount of read data and literal bytes written to the second buffer; and
performing a check whether the amount of data in the second buffer exceeds a predefined threshold,
wherein, when the amount of data in the second buffer exceeds the predetermined threshold:
writing a first portion of the read data from the second buffer back to the first buffer,
storing a second portion of the read data from the second buffer which exceeded the predetermined threshold in the second buffer, and
updating the amount of read data in the second buffer by subtracting the amount of data that was transferred to the first buffer.

15. The method according to claim 14, wherein
read data is read from either first buffer or from the second buffer,
a read data bypass signal selects read data from the second buffer, and
data read from the second buffer is written back to a head of the second buffer.

16. The method according to claim 14, wherein the first buffer is a history buffer and the second buffer is a write data buffer.

17. A system for a hardware decompression write pipeline, the system comprising:
a first buffer configured to store a plurality of data corresponding to a plurality of entities;
a second buffer;
an entity processing circuit configured to obtain data from the first buffer and to store the data, as well as any literal bytes that are encountered, in the second buffer; and
a read-after-write conflict detection circuit that keeps track of an amount of data in the second buffer, and performs a check whether the amount of data exceeds a predetermined threshold,
wherein, when the amount of data in the second buffer exceeds the predetermined threshold, the read-after-write conflict detection circuit is further configured to:
write a first portion of data from the second buffer back to the first buffer, and
retain a second portion of data in the second buffer, which exceeded the predetermined threshold.

18. The system according to claim 17, the system further comprising:
a read-after-write conflict detection circuit configured to perform a check, whether data is in the process of being transferred from the second buffer to the first buffer at the same time that a length-distance entity is being processed,
wherein, when data is in the process of being transferred from the second buffer to the first buffer, the read-after-write conflict detection circuit is further configured to:
stall the launch of a read request associated with a length-distance entity until the transfer of data from the second buffer to the first buffer is complete.

19. The system according to claim 17, wherein the first buffer is a history buffer and the second buffer is a write data buffer.

20. The system according to claim 17, wherein the predetermined threshold is equal to a width of the first buffer.

* * * * *

UNITED STATES PATENT AND TRADEMARK OFFICE
CERTIFICATE OF CORRECTION

| | | |
|---|---|---|
| PATENT NO. | : 9,792,044 B2 | Page 1 of 2 |
| APPLICATION NO. | : 15/042793 | |
| DATED | : October 17, 2017 | |
| INVENTOR(S) | : Shih | |

It is certified that error appears in the above-identified patent and that said Letters Patent is hereby corrected as shown below:

In the Drawings

On sheet 5 of 8, in FIG. 5, under Reference Numeral 528, Line 1, delete "remaininig" and insert -- remaining --, therefor.

In the Specification

Column 1, Line 27, after "contrast" insert -- , --.

Column 1, Line 46, delete "op" and insert -- up --, therefor.

Column 2, Line 45, delete "date" and insert -- data --, therefor.

Column 2, Line 8, delete "road" and insert -- read --, therefor.

Column 2, Line 65, delete "buffer:" and insert -- buffer; --, therefor.

Column 3, Line 54, delete "compression" and insert -- decompression --, therefor.

Column 4, Line 9, delete "foil" and insert -- full --, therefor.

Column 5, Line 53, delete "tire" and insert -- the --, therefor.

Column 5, Line 54, delete "/bytes." and insert -- /bytes, --, therefor.

Column 6, Line 11, delete "storage, it" and insert -- storage. It --, therefor.

Column 6, Line 26, delete "Inputs" and insert -- inputs --, therefor.

Column 6, Line 65, delete "entitles." and insert -- entities. --, therefor.

Signed and Sealed this
Fifth Day of June, 2018

Andrei Iancu
*Director of the United States Patent and Trademark Office*

CERTIFICATE OF CORRECTION (continued)
U.S. Pat. No. 9,792,044 B2

Column 7, Line 5, delete "ail" and insert -- all --, therefor.

Column 7, Line 32, delete "information" and insert -- Information --, therefor.

Column 7, Line 63, delete "entitles" and insert -- entities --, therefor.

Column 8, Line 8, delete "entitles" and insert -- entities --, therefor.

Column 8, Line 38, delete "date" and insert -- data --, therefor.

Column 9, Line 6, delete "noted," and insert -- noted --, therefor.

Column 10, Line 39, delete "foe" and insert -- the --, therefor.

Column 10, Line 49, after "different" insert -- , --.

Column 10, Line 61, delete "began" and insert -- begun --, therefor.

Column 10, Line 61, delete "entitles" and insert -- entities --, therefor.

Column 12, Line 61, after "pipeline" insert -- in accordance with one or more embodiments. Specifically, FIG. 6a illustrates a --.

Column 13, Line 20, after "entity" insert -- "1" --.

Column 13, Line 47, delete "most" and insert -- must --, therefor.

Column 14, Line 7, delete "foe" and insert -- the --, therefor.

Column 14, Line 12, after "thereof" insert -- , --.

Column 15, Line 30, after "art" insert -- , --.